US008716054B2

(12) United States Patent
Jeong

(10) Patent No.: US 8,716,054 B2
(45) Date of Patent: May 6, 2014

(54) IMAGE SENSOR AND METHOD FOR FABRICATING THE SAME

(71) Applicant: Dongbu Hitek Co., Ltd., Gyeonggi-do (KR)

(72) Inventor: Seong Hun Jeong, Gyeonggi-do (KR)

(73) Assignee: Dongbu HiTek Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/742,682

(22) Filed: Jan. 16, 2013

(65) Prior Publication Data
US 2013/0307039 A1 Nov. 21, 2013

(30) Foreign Application Priority Data

May 15, 2012 (KR) .......................... 10-2012-0051273

(51) Int. Cl.
*H01L 21/00* (2006.01)
*H01L 31/0216* (2014.01)
(52) U.S. Cl.
USPC .................................... 438/69; 257/E31.119
(58) Field of Classification Search
CPC .................. H01L 27/14609; H01L 31/02161; H01L 27/14643
USPC ..................................... 438/69; 257/E31.119
See application file for complete search history.

(56) References Cited

U.S. PATENT DOCUMENTS

| 2008/0038864 | A1* | 2/2008 | Yoo et al. | 438/70 |
| 2008/0284024 | A1* | 11/2008 | Ryu et al. | 257/751 |
| 2009/0159944 | A1* | 6/2009 | Oh | 257/292 |
| 2010/0109113 | A1* | 5/2010 | Jang | 257/432 |
| 2010/0155873 | A1* | 6/2010 | Lim | 257/460 |
| 2012/0009719 | A1* | 1/2012 | Ahn et al. | 438/69 |

FOREIGN PATENT DOCUMENTS

JP 2006-080522 3/2006

OTHER PUBLICATIONS

Aug. 14, 2013, Korean Office Action issued for related application No. KR 10-2012-0051273.

* cited by examiner

*Primary Examiner* — Steven J Fulk
(74) *Attorney, Agent, or Firm* — Sherr & Jiang, PLLC

(57) ABSTRACT

A method for fabricating an image sensor having a pixel region and a logic region, which includes one of: (1) forming a photodiode in a substrate at the pixel region, (2) forming a first interlayer insulating layer on the substrate, (3) forming a first stop film on the first interlayer insulating layer, (4) forming an insulating film on the first stop film, (5) forming a second stop film on the insulating film, (6) forming at least one trench by selective etching of the second stop film and the insulating film positioned at the pixel region for exposing the first stop film, (7) forming conductive material on the second stop film to fill the at least one trench, and (8) forming a zero wiring layer in the at least one trench by planarizing the conductive material until the second stop film is exposed.

19 Claims, 15 Drawing Sheets

IMAGE SENSOR AND METHOD FOR FABRICATING THE SAME

Figure 1:
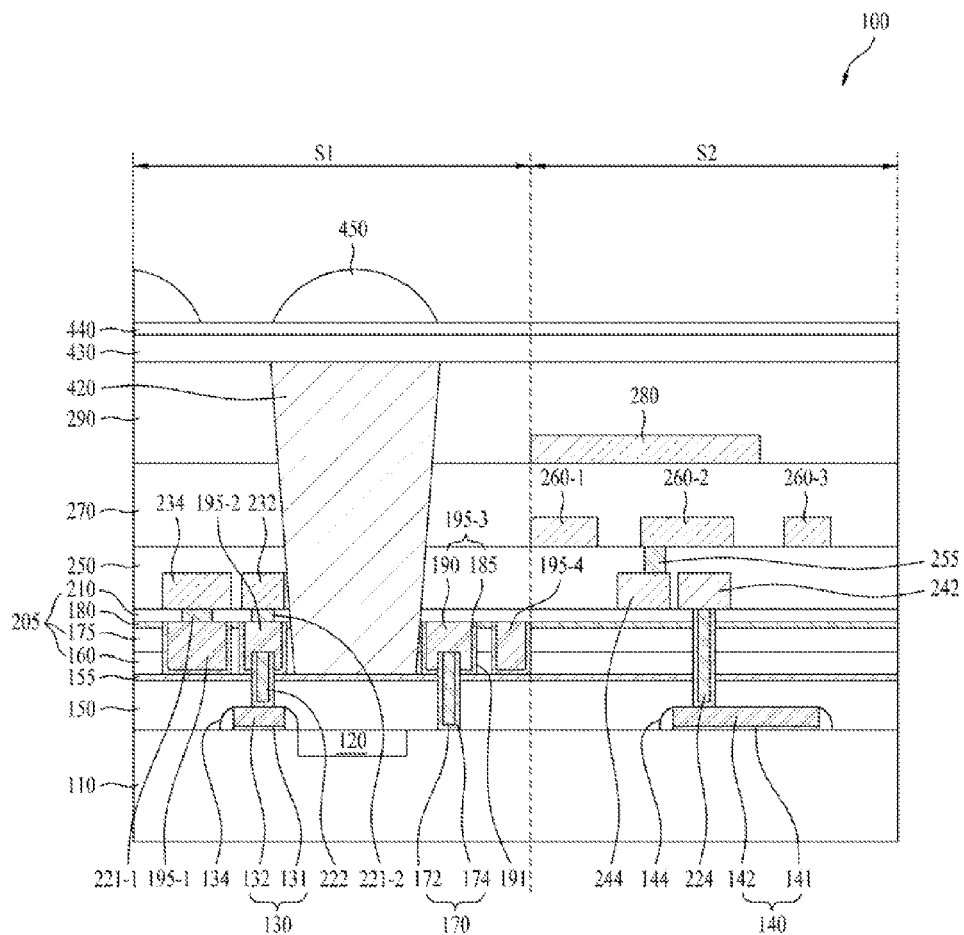

This application claims the benefit of Korean Patent Application No. 10-2012-0051273, filed on May 15, 2012, which is hereby incorporated by reference in its entirety.

BACKGROUND

Some image sensors are semiconductor devices which convert an optical image into an electric signal. Two types of image sensors are CCD (Charge Coupled Device) image sensors and CMOS (Complementary Metal Oxide Semiconductor) image sensors.

Compared to a CCD image sensor, a CMOS image sensor may have advantages, such as: (1) a relatively simple driving system, (2) flexibility of scanning system design, (3) a signal processing circuit may be integrated into a single chip enabling to make a product smaller, and/or (4) power consumption is relatively low. Accordingly, CMOS image sensors have many desirable applications, such as DSCs (Digital Still Cameras), PC cameras, mobile cameras, and other similar applications.

Some CMOS image sensors are either 3T type, 4T type, or 5T type CMOS image sensor, depending on the number of transistors in a unit pixel. A unit pixel may include one photodiode and depending on a type of CMOS image sensor at least one transistor (e.g. at least one of a transfer transistor, a reset transistor, a select transistor, and/or a drive transistor). An image sensor may include a microlens for collecting light, a color filter for filtering the collected light, a photodiode for sensing the light passed through the color filter, and at least one transistor electrically connected to the photodiode.

SUMMARY

Embodiments relate to an image sensor and a method for fabricating an image sensor. Embodiments relate to an image sensor configured to substantially prevent an interlayer insulating layer from being lost or a zero wiring layer from being damaging by an etching or planarizing, which may result in improvements in image sensor sensitivity.

Additional advantages, objects, and features of the disclosure will be set forth in part in the description which follows and in part will become apparent to those having ordinary skill in the art upon examination of the following or may be learned from practice of embodiments. The objectives and other advantages of the invention may be realized and attained by the structure particularly pointed out in the written description and claims hereof as well as the appended drawings.

Embodiments relate to a method for fabricating an image sensor having a pixel region and a logic region, the method includes at least one of the following steps: (1) Forming a photodiode in a substrate at the pixel region. (2) Forming a first interlayer insulating layer on/over the substrate. (3) Forming a first stop film on/over the first interlayer insulating layer. (4) Forming an insulating film on/over the first stop film. (5) Forming a second stop film on/over the insulating film. (6) Forming at least one trench for exposing the first stop film by selective etching of the second stop film and the insulating film positioned at the pixel region. (7) Forming conductive material on/over the second stop film to fill the at least one trench. (8) Forming a zero wiring layer in the at least one trench by planarizing the conductive material until the second stop film is exposed.

In embodiments, the method may include forming at least one contact in contact with the substrate at the pixel region, wherein the at least one contact passes through the first interlayer insulating layer and the first stop film before the step of forming at least one trench. In embodiments, the insulating film and the first stop film may have etch selectivity of approximately 8~10:1 therebetween and/or the conductive material and the second stop film may have selectivity over approximately 100:1 therebetween. In embodiments, the step of forming a first stop film may include the step of depositing a silicon nitride film to form the first stop film and/or the step of forming a second stop film includes the step of depositing $HfO_2$ to form the second stop film.

In embodiments, the method may include the step of forming a plurality of gates on/over the substrate at the pixel region and/or the step of forming contacts in contact with upper sides of the plurality of gates that pass through the first stop film and a portion of the first interlayer insulating layer, before the step of forming the first interlayer insulating layer, wherein the zero wiring layer is formed to contact with each of the contacts.

In embodiments, a method may include at least one of: (1) forming a first wiring layer on/over the second stop film at the pixel region and the logic region, (2) forming a second interlayer insulating layer on/over the second stop film to cover the first wiring layer, (3) forming a second wiring layer on/over the second interlayer insulating layer at the logic region, and/or (4) forming at least one third interlayer insulating layer on/over the second interlayer insulating layer at the pixel region and the logic region to cover the second wiring layer.

In embodiments, a method may include at least one of: (1) forming a recess matched to the photodiode by selective etching of the at least one third interlayer insulating layer, the second interlayer insulating layer, the second stop film, the insulating film at the pixel region until the first stop film is exposed, and (2) forming a light guide layer by filling an insulating material having a refractive index different from the at least one third interlayer insulating layer, the second interlayer insulating layer, and the insulating film in the recess.

In embodiments, a method may include at least one of: (1) forming a color filter layer on/over the light guide layer and the at least one third interlayer insulating layer, and (2) forming a microlens on the color filter layer. In embodiments, the method may include at least one of: (1) forming a third stop film on/over the second interlayer insulating layer at the pixel region and the logic region and on/over the second wiring layer on the logic region, (2) etching the at least one third interlayer insulating layer at the pixel region until the third stop film is exposed, (3) forming a color filter layer on/over the third stop film exposed at the pixel region and on/over the at least one third interlayer insulating layer at the logic region, and (4) forming a microlens on/over the color filter layer at the pixel region. In embodiments the forming of the microlens on/over the color filter layer at the pixel region may be performed after the forming of the second wiring layer and before the forming of the at least one third interlayer insulating layer.

Embodiments may include at least one of: (1) forming a third stop film on/over the second interlayer insulating layer at the pixel region and/or the logic region and on/over the second wiring layer at the logic region, (2) etching the at least one third interlayer insulating layer at the pixel region until the third stop film is exposed, (3) forming a recess matched to the photodiode by selective etching of the third stop film, the second interlayer insulating layer, the second stop film, and the insulating film at the pixel region until the first stop film is exposed, (4) forming a light guide layer by filling an insulating material having a refractive index different from the refractive index of the second interlayer insulating layer and the insulating film in the recess, (5) forming a color filter layer on/over the light guide layer at the pixel region, and (6) forming a microlens on/over the color filter layer after forming the second wiring layer and before forming the at least one third interlayer insulating layer.

In embodiments, an image sensor having a pixel region and a logic region may include at least one of: (1) a photodiode formed in a substrate at the pixel region, (2) a first interlayer insulating layer formed on/over the substrate at the pixel region and the logic region, (3) a first stop film formed on/over the first interlayer insulating layer, (4) an insulating film formed on/over the first stop film, (5) a second stop film formed on/over the insulating film, (6) a zero wiring layer formed in the first insulating film at the pixel region, and (7) a first wring layer formed on/over the second stop film at the pixel region and the logic region. In embodiments, the first stop film may be a silicon nitride film and/or the second stop film may be formed to include $HfO_2$.

In embodiments, the image sensor may include at least one of: (1) a plurality of gates formed on/over the substrate at the pixel region and (2) a plurality of contacts connected to the plurality of gates passed through the first stop film and a portion of the first interlayer insulating layer, wherein the zero wiring layer connects the plurality of contacts to one another. In embodiments, the zero wiring layer may include a trench formed in the insulating film to expose the first stop film and/or a conductive layer which may be filled in the trench.

In embodiments, the image sensor include at least one of: (1) a second interlayer insulating layer formed on/over the first wring layer and the second stop film at the pixel region and the logic region, (2) at least one third interlayer insulating layer formed on/over the second interlayer insulating layer, and (3) a light guide layer formed in at least one of the insulating film, the second stop film, the second interlayer insulating layer, and the at least one third interlayer insulating layer at the pixel region to match to the photodiode.

In embodiments, the image sensor may include at least one of: (1) a second interlayer insulating layer formed on the first wiring layer and the second stop film at the pixel region and the logic region, (2) a third stop film formed on the second interlayer insulating layer at the pixel region and the logic region and on the first wiring layer at the logic region, (3) at least one third interlayer insulating layer formed on/over the third stop film at the logic region, (4) a color filter layer formed on/over the third stop film at the pixel region and on/over the at least one third interlayer insulating layer on/over the logic region, and (5) a microlens formed on/over the color filter layer at the pixel region. In embodiments, an image sensor may include a light guide layer formed to pass at least one of the third stop film, the second interlayer insulating layer, the second stop film, and the insulating film at the pixel region to match to the photodiode.

Embodiments may prevent the interlayer insulating layer from being lost and/or the wiring layer from being damaged by etching and/or planarizing processes, which may improve sensitivity of the image sensor.

It is to be understood that both the foregoing general description and the following detailed description of embodiments are exemplary and explanatory and are intended to provide further explanation of embodiments as claimed.

DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

Example FIG. 1 illustrates a section of an image sensor, in accordance with embodiments.

Figure 2:
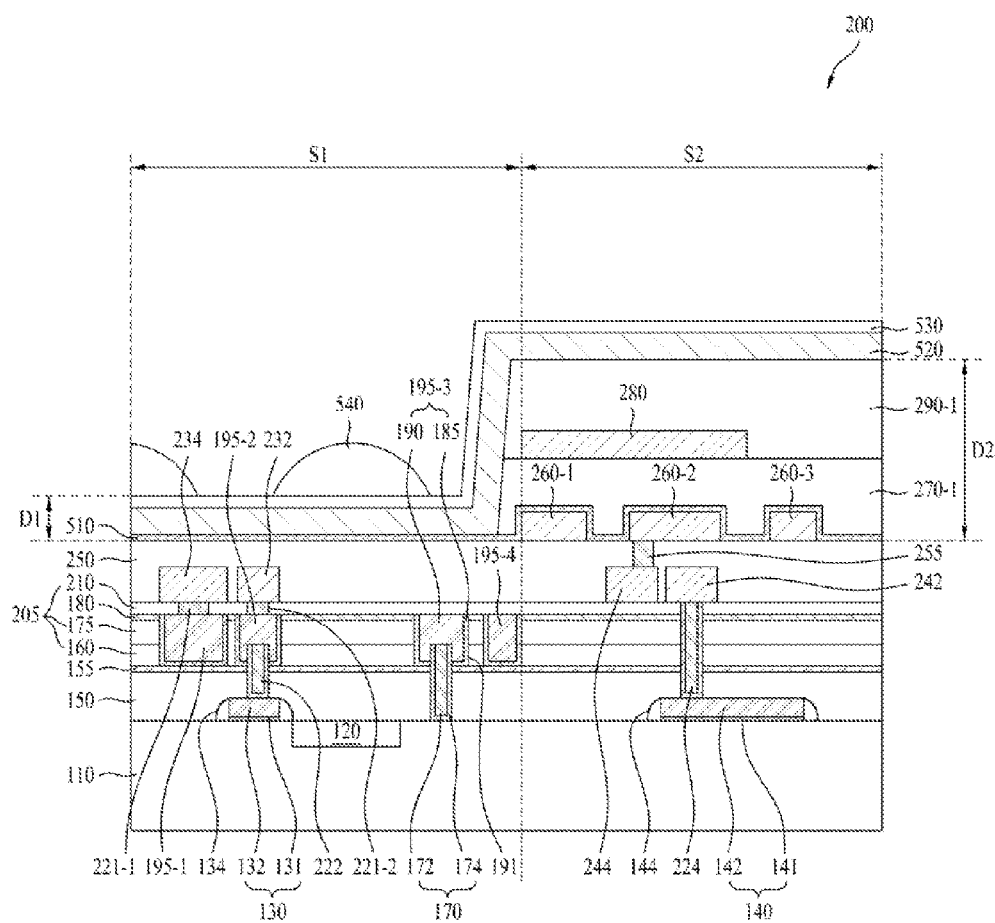

Example FIG. 2 illustrates a section of an image sensor, in accordance with embodiments.

Figure 3:
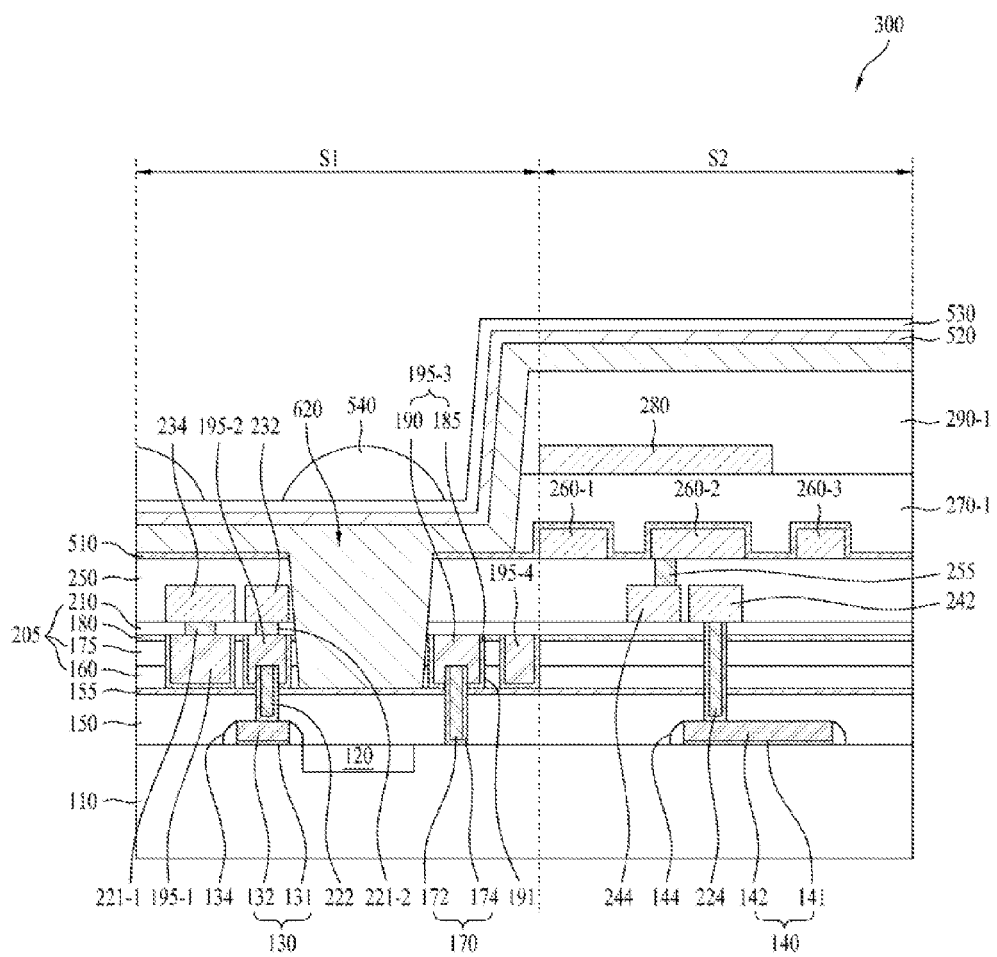

Example FIG. 3 illustrates a section of an image sensor, in accordance with embodiments.

Example FIGS. 4 to 14 illustrate sections showing a method of fabricating an image sensor, in accordance with embodiments.

Figure 15:
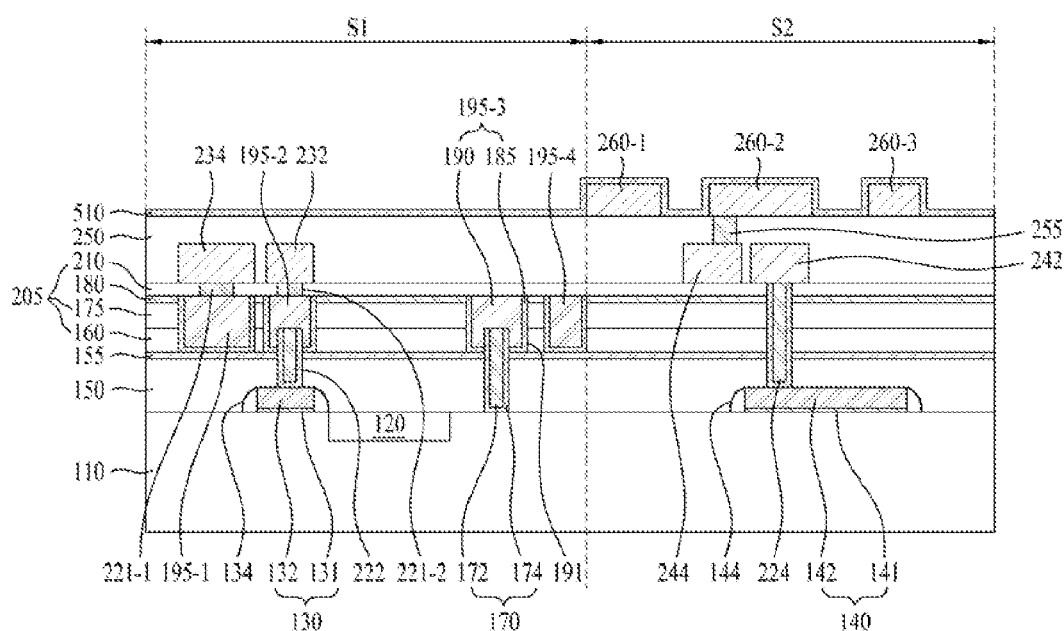
Figure 16:
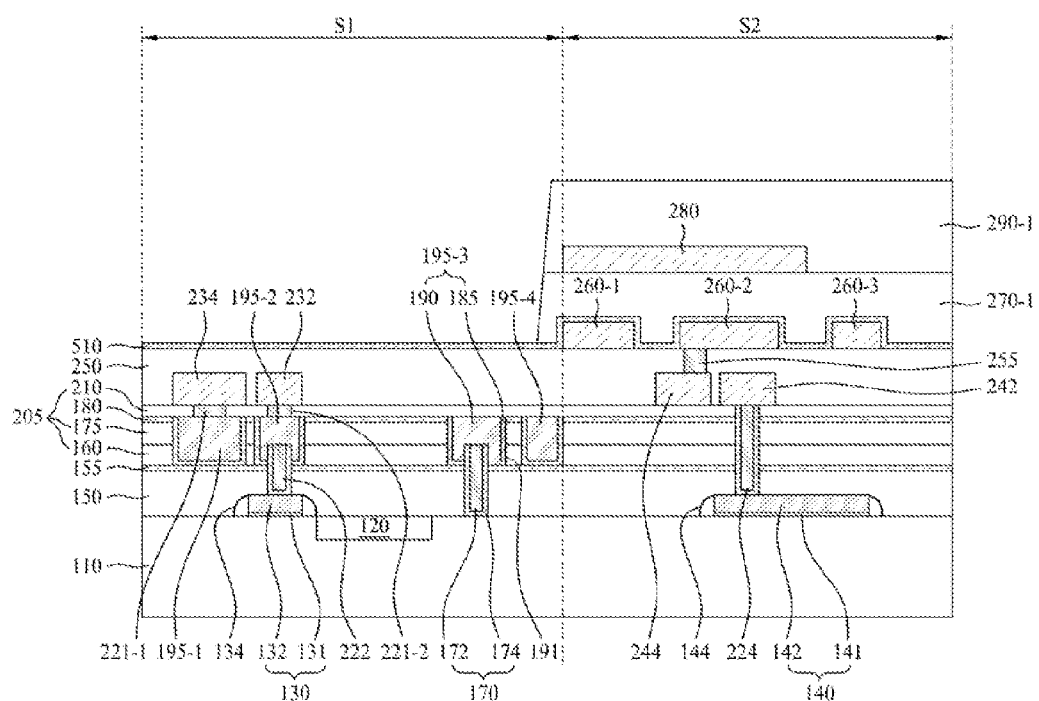
Figure 17:
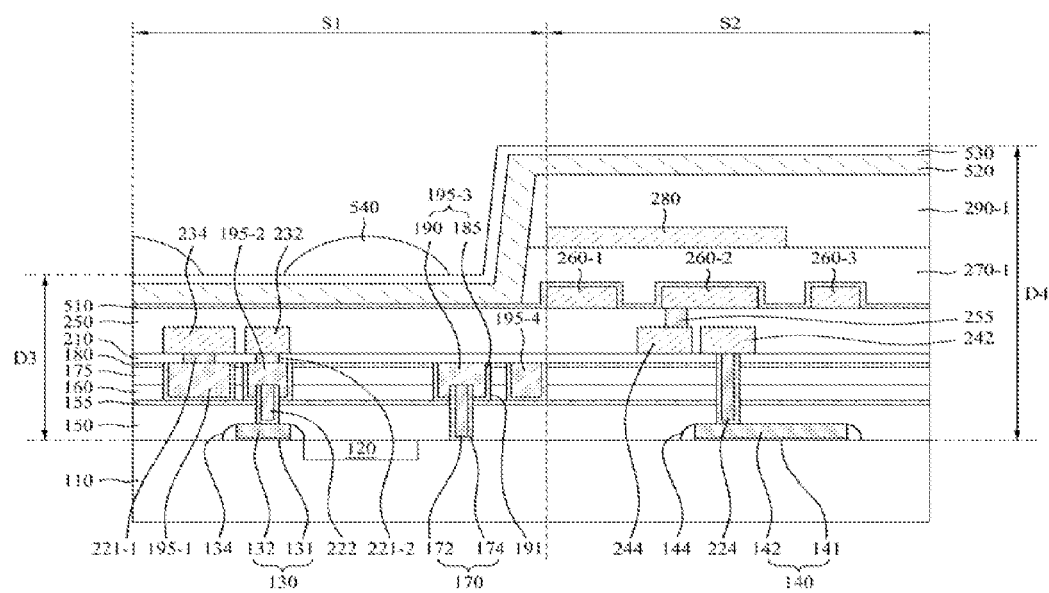

Example FIGS. 15 to 17 illustrate sections showing a method of fabricating an image sensor, in accordance with embodiments.

Figure 18:
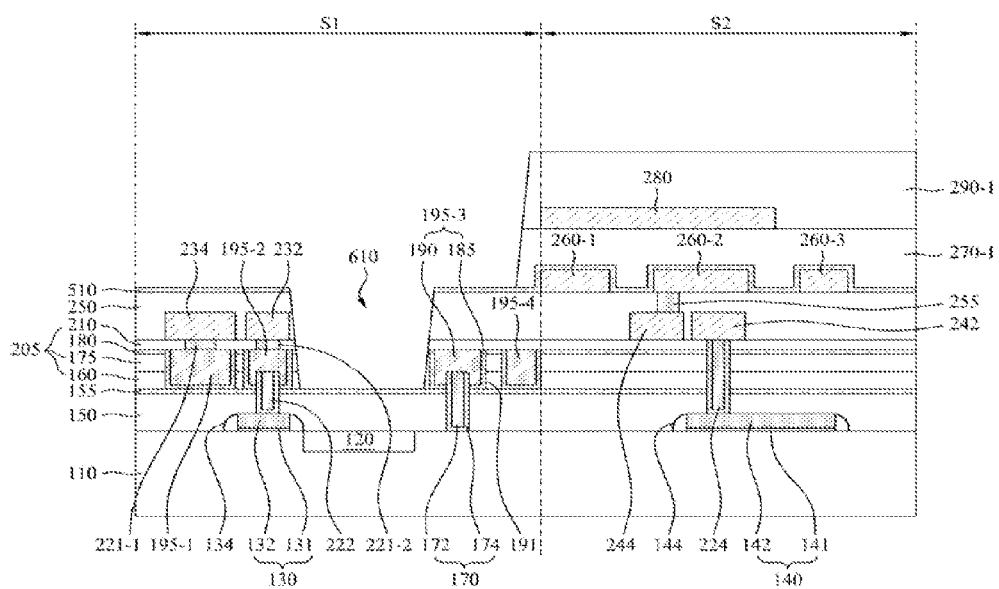
Figure 19:
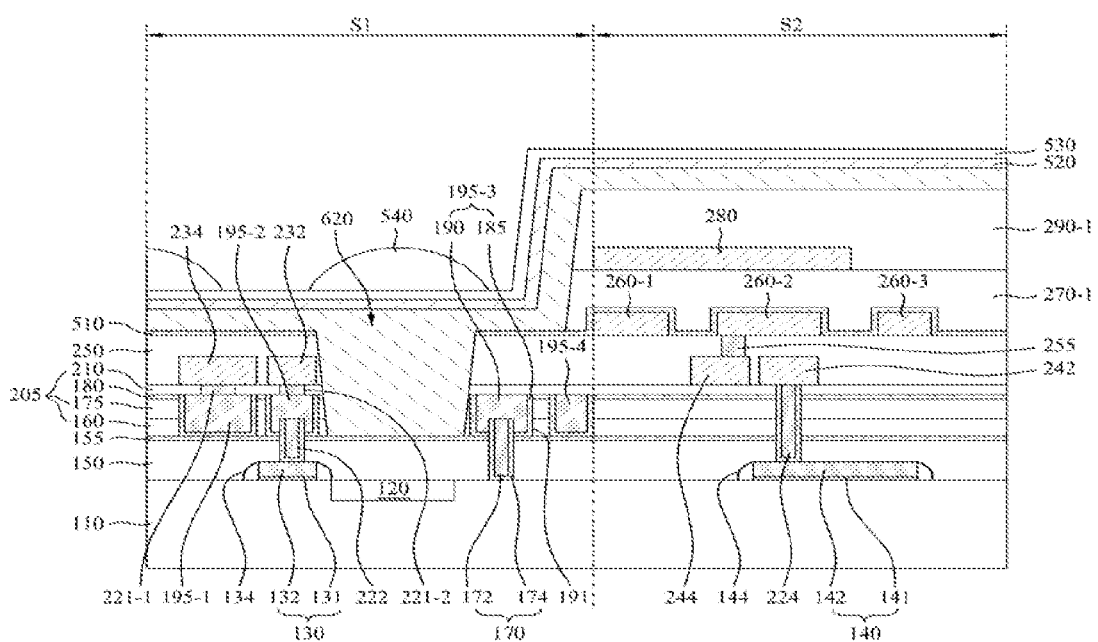

Example FIGS. 18 to 19 illustrate sections showing a method of fabricating an image sensor, in accordance with embodiments.

Figure 20:
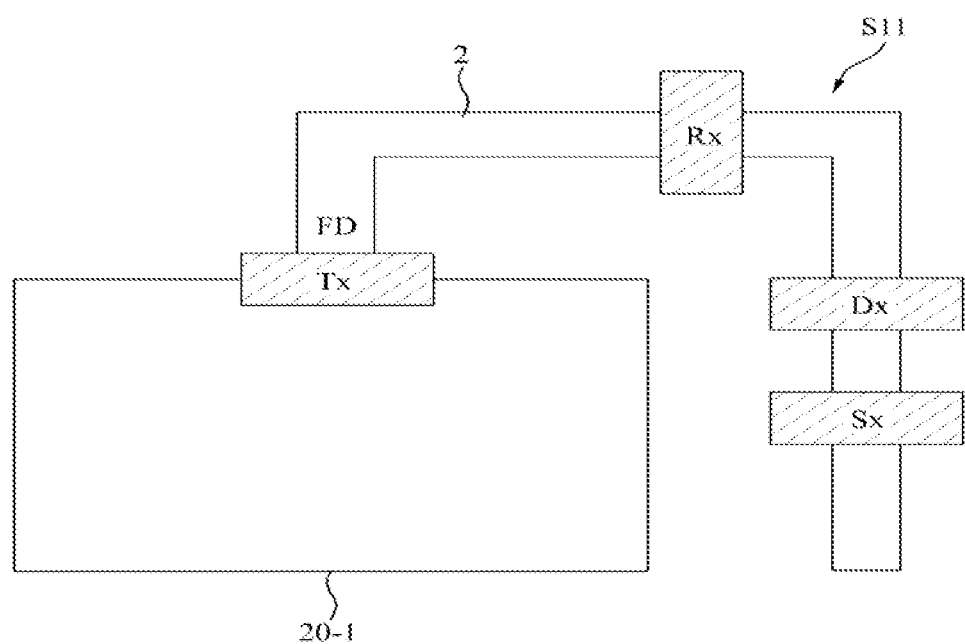

Example FIG. 20 illustrates a block diagram of a unit pixel formed in the pixel region in FIG. 1, in accordance with embodiments.

DESCRIPTION

Reference will now be made in detail to embodiments, examples of which are illustrated in the accompanying drawings. In description of embodiments, if it is described that a layer (a film), a region, a pattern, or a structure is formed "on" or "under" a substrate, a layer (a film), a region, a pad, or a pattern, the "on", or "under" implies that the layer (the film), the region, the pattern, or the structure is formed "on" or "under" the substrate, the layer (the film), the region, the pad, or the pattern directly or indirectly with other substrate, layer (film), region, pad, or pattern, disposed therebetween. And, a reference on the "on" or "under" is the drawing.

A size shown in a drawing may be exaggerated, omitted or shown schematically for convenience or clarity of description. And, a size of an element may not be shown to scale, perfectly. Wherever possible, the same reference numbers will be used throughout the drawings to refer to the same or like parts. An image sensor and a method for fabricating the same in accordance with embodiments will be described with reference to attached drawings.

FIG. 1 illustrates a section of an image sensor 100, in accordance with embodiments. The image sensor 100 may be divided into a pixel region S1 and a logic region S2. The pixel region S1 may be a region having a pixel formed thereon for sensing a light, and the logic region S2 may be a region having a logic device or circuit formed thereon for processing the light sensed at the pixel region S1 into an electric signal to change the light to a data.

The image sensor 100 may include a substrate 110, a pixel gate 130, a logic gate 140, a first interlayer insulating layer 150, a first stop film 155, an insulating film 205, a second stop film 180, a zero wiring layer 195-1 to 195-4, a first wiring layer 232, 234, 242, and 244, a second interlayer insulating layer 250, a second wiring layer 260-1 to 260-3, a third interlayer insulating layer 270, a third wiring layer 280, a fourth interlayer insulating layer 290, a plurality of contacts 170, 221, 222, 224, and 255, a light guide layer 420, a color filter layer 430, a planarizing layer 440, and/or a microlens 450, in accordance with embodiments.

The pixel region S1 of the image sensor 100 may include a plurality of unit pixel regions. For the purposes of description, FIG. 1 only illustrates one of the unit pixels. The unit pixel region may be defined as a region having a pixel which is a smallest unit for sensing the light positioned thereon. The substrate 110 may be a semiconductor substrate. The substrate 110 may have an isolation layer for isolating an active region from an isolation region.

The photodiode 120 may be provided in the substrate 110 at the pixel region S1. For example, the photodiode 120 may be provided at an active region of the substrate 110. In embodiments, the photodiode 120 may be an n type impurity region having n type impurities injected in a p type semiconductor substrate 110. In embodiments, a pn junction may be formed between the p type semiconductor substrate 110 and the n type impurity region.

The pixel gate 130 may be provided on the substrate 110 at the pixel region S1 and the logic gate 140 may be provided on the substrate 110 at the logic region 32. The pixel gate 130 may include a pixel gate insulating film 131 and a pixel gate electrode 132. The pixel gate electrode 132 may have a sidewall having a pixel spacer 134 formed thereon. The logic gate 140 may include a logic gate insulating film 141 and a logic gate electrode 142. The logic gate electrode 142 may have a sidewall having a logic spacer 144 formed thereon.

FIG. 20 illustrates a block diagram of a unit pixel S11 formed in the pixel region S1 (e.g. shown in FIG. 1), in accordance with embodiments. The unit pixel S11 may include a photodiode 120, a transfer transistor Tx, a reset transistor Rx, a drive transistor Dx, and a select transistor Sx. The photodiode 120 may be provided at the active region 2 of the substrate 110 positioned on one side of the transfer transistor Tx. A floating diffusion region FD may be provided at the active region 2 of the substrate 110 positioned on the other side of the transfer transistor Tx.

The pixel gate electrode 132 may be a gate electrode of the transistor Tx, Rx, Dx, or Sx of the unit pixel S11 of the image sensor 100. In embodiments, the pixel gate electrode 130 shown in FIG. 1 may be a gate electrode of the transfer electrode Tx. There may be a source region and a drain region provided in the substrate 110 at the pixel region S1 on opposite sides or one side of at least one of the pixel gate electrodes of the transistors Tx, Rx, Dx, and Sx. In embodiments, a source region and a drain region may be provided in the substrate 110 at the logic region S2 on opposite side or one side of the logic gate electrode 142.

The first interlayer insulating layer 150 may be provided on the substrate 110 having the photodiode 120, the pixel gate electrode 130, and the logic gate 140 formed thereon. In embodiments, the first interlayer insulating layer 150 may be PMD (Pre Metal Dielectric) (e.g. the first interlayer insulating layer 150 buries the photodiode 120, the pixel gate electrode 130, and the logic gate 140 and may be formed before formation of wiring layers).

The first stop film 155 may be provided on the first interlayer insulating layer 150 at the pixel region S1 and the logic region S2. In embodiments, the first stop layer 155 may be a silicon nitride film (e.g. SiN) and may have a thickness of approximately 0.1 µm.

The insulating film 205 may be provided on the first stop film 155 at the pixel region S1 and the logic region S2. The insulating film 205 may include a first insulating film 160 positioned on the first stop film 155, a second insulating film 175 positioned on the first insulating film 160, and a third insulating film 210 positioned over the second insulating film 175. In embodiments, the insulating film 205 may be a silicon oxide film (e.g. $SiO_2$).

The second stop film 180 may be positioned on the second insulating film 175. In embodiments, the second insulating film 175 may be positioned between the second insulating film 175 and the third insulating film 210. In embodiments, the second insulating film 175 may be formed of $SiO_2$, and may have a thickness of approximately 0.1 µm to 0.2 µm. In embodiments, the second stop film 180 may be formed of $HfO_2$ and may have a thickness below approximately 0.01 µm.

The zero wiring layers 195-1 to 195-4 may be positioned between the first stop film 155 and the third insulating film 210 at the pixel region S1 that passes through the second stop film 180, the first insulating film 160, and the second insulating film 175 at the pixel region S1. The zero wiring layer 195-1 to 195-4 may have an underside in contact with the first stop film 155, and an upper side in contact with the third insulating film 210. Hereafter, the 195-1 to 195-4 will be referred to as "MO".

In embodiments, the zero wiring layer MO can make possible a GIC (Global interconnection) with respect to the transistors formed at the pixel region S1. For example, the zero wiring layer (e.g. 195-2) may connect a plurality of the unit pixels to a gate of one of the transistors (e.g. the transfer transistor).

In embodiments, the zero wiring layer 195-1 may include at least one of: (1) a first zero wiring layer (e.g. 195-2) for connecting gates of the transfer transistors of a plurality of the unit pixels to one another, (20) a second zero wiring layer for connecting gates of the select transistors of the plurality of the unit pixels to one another, and/or (3) a third zero wiring layer for connecting gates of the reset transistors of the plurality of the unit pixels to one another.

In embodiments, the zero wiring layer MO may include a trench 191 passing through the second stop film 180, the second insulating film 175, and the first insulating film 160 at the pixel region S1 to selectively expose the first stop film 155 and a conductive material 190 in the trench 191. The zero wiring layer MO may include a barrier metal 185 between the trench 191 and the conductive material 190, in accordance with embodiments. In embodiments, the conductive material may include at least one of tungsten, copper, and/or an alloy including at least one of tungsten and copper. Barrier metal 185 may prevent ions of the conductive material from diffusing into the substrate 110 and may be a metal including at least one of Ni, Ti, Ta, Pt, and/or Mo, in accordance with embodiments.

The first stop film 155 may serve as an etch stop film when the insulating film 160 and 175 is etched when forming the trench 191, in accordance with embodiments. In embodiments, the second stop film 180 may serve as a stop film during a planarizing process after the conductive material is filled in the trench 191. Accordingly, in embodiments, the first stop film 155 may prevent the substrate from being damaged during etching and/or second stop film 180 may prevent the first interlayer insulating layer 150 and the zero wiring layer MO from being lost during a planarizing process. In embodiments, the second stop film 180 may serve as an etch stop film at the time of formation of a recess for formation of the light guide layer 420.

In embodiments, the first contact 0 170 may be connected between the substrate 110 and the zero wiring layer (e.g. 195-3). In embodiments, the second contact 0 222 may be connected between the pixel contact electrode 132 and the zero wiring layer (e.g. 195-2). The contact 0 170 and 222 may include a conductive material 172 and/or a barrier metal 174, in accordance with embodiments. In embodiments, the first contact 0 170 may pass through the first stop film 155 and the first interlayer insulating layer 150, with one end in contact with the first wiring layer (e.g. 195-3) and the other end in contact with the substrate 110. In embodiments, the second contact 0 222 may pass through the first stop film 155 and a portion of the first interlayer insulating layer 150, with one end in contact with the first wiring layer (For an example, 195-2), and the other end in contact with an upper side of the pixel gate electrode 132.

In embodiments, the pixel gate electrode 132 may be a gate electrode of each of the transistors (e.g. the transfer transistors Tx) which are positioned at the pixel region S1 to perform the same functions. In embodiments, there may be a plurality of second contact 0 222 which may be in contact with the gates of the transistors at the pixel region S1, respectively.

In embodiments, any one of the zero wiring layers (e.g. 195-2) may be in contact with all of the plurality of second contacts 0 222 respectively connected to the gates of the transfer transistors at the pixel region. As the plurality of second contacts 0 222 are electrically connected to one another with the zero wiring layer (e.g. 195-2), the global interconnection can be realized, in accordance with embodiments.

The third insulating film 210 may be formed on the second stop film 180 and the first wiring layer 232, 234, 242, and 244 may be formed on the third insulating film 210 at the pixel region S1 and the logic region S2, in accordance with embodiments. Hereafter, the 232, 234, 242, and 244 will be called as "M1". There may be no wiring layer present between the first wiring layer 232 and 234 at the pixel region S1 and a light receiving portion or between the zero wiring layer MO and the first wiring layer M1, in accordance with embodiments. In embodiments, the light receiving portion may include at least one of the microlens 450 and the color filter layer 430.

The first contact 221-1 and 222-2 positioned at the pixel region S1 may connect the zero wiring layer 195-1 and 195-2 to the first wiring layer 232 and 234 passed through the third insulating film 210 at the pixel region S1, in accordance with embodiments. In embodiments, the first contact 224 positioned at the logic region S2 may connect the first wiring layer 242 to the logic gate electrode 142 that passes through the third insulating film 210, the second stop film 180, the second insulating film 175, the first insulating film 160, and a portion of the first interlayer insulating layer 150 at the logic region S2.

The second interlayer insulating layer 250 may be formed on the third insulating film 210 at the pixel region S1 and the logic region S2, which may bury the first wiring layer M1. The second wiring layer 260-1 to 260-3 may be formed on the second interlayer insulating layer 250 at the logic region S2. Hereafter, the 260-1 to 260-3 will be called as "M2".

The second contact connects the first wiring layer (e.g. 244) to the second wiring layer (e.g. 260-2) that passes through a portion of the second interlayer insulating layer 250 at the logic region S2. The third interlayer insulating layer 270 may be formed on the second interlayer insulating layer 250 at the pixel region S and the logic region S2, which may bury the second wiring layer M2. The third wiring layer 280 may be formed on the third interlayer insulating layer 270 at the logic region S2. Hereafter, the 280 will be called as "M3". The fourth interlayer insulating layer 290 may be formed on the third interlayer insulating layer 270 at the pixel region S and the logic region S2, which may bury the third wiring layer M3.

In embodiments, there may be at least one interlayer insulating layer on the fourth interlayer insulating layer 290 at the pixel region S and additionally at the logic region S2. In embodiments, a fourth wiring layer may be formed in the interlayer insulating layer at the logic region.

The light guide layer 420 may be formed in at least one of the insulating film 160, 175, and 210, the second stop film 180, and the second to fourth interlayer insulating layers 250, 270, and 290 at the pixel region S1 to face the photodiode 120, the color filter layer 430, and the microlens 450 in a vertical direction. In embodiments, the light guide layer 420 may have a lower end in contact with the first stop film 155 that passes through the insulating films 160, 175, and 210, the second stop film 180, and the second to fourth interlayer insulating layers 250, 270, and 290 at the pixel region S1. The light guide layer 420 may be formed of dielectric having a refractive index different from the insulating films 160, 175, and 210, and the second to fourth interlayer insulating layers 250, 270, and 290, in accordance with embodiments. In embodiments, the light guide layer 420 may have a refractive index higher than the refractive indices of the insulating films 160, 175, and 210, and the second to fourth interlayer insulating layers 250, 270, and 290.

Some embodiments illustrated in FIG. 1 relate to the light guide layer 420 having a top side in contact with the color filter layer 430. However, other embodiments herein disclosed are not limited to this example configuration. For example, in embodiments, the top side of the light guide layer 420 may be positioned between the second interlayer insulating layer 150 and the fourth interlayer insulating layer 290.

The light guide layer 420 may have an increasing diameter which increases as the light guide layer 420 goes from a top side to a bottom side. In embodiments, the light guide layer 420 may have a diameter which decreases as the light guide layer 420 goes from the top side to the bottom side.

The color filter layer 430 may be formed on the light guide layer 420 and the fourth interlayer insulating layer 290. The color filter layer 430 may include a plurality of color filters (e.g. a blue color filter, a green color filter, and a red color filter) arranged/configured to match or align with the photodiode 120, in accordance with embodiments. In embodiments, the blue color filter, the green color filter, and the red color filter may have thicknesses different from one another. In embodiments, in order to protect the color filter layer 430 from moisture and scratches, a planarizing layer 440 may be formed on the color filter layer 430 at the pixel region S1 and the logic region S2.

The microlens 450 may be formed on the planarizing layer 440 at the pixel region S1 to match or align with the photodiode 120 or the color filter in a vertical direction. In embodiments, microlens 450 may have a convex (e.g. a semi-sphere) shape for collecting the light, but other embodiments are not limited to this configuration.

Example FIG. 2 illustrates a section of an image sensor, in accordance with embodiments. The image sensor 200 may include at least one of a substrate 110, a pixel gate 130, a logic gate 140, a first interlayer insulating layer 150, a first stop film 155, an insulating film 205, a second stop film 180, a zero wiring layer 195-1 to 195-4, a first wiring layer 232, 234, 242, and 244, a second interlayer insulating layer 250, a second wiring layer 260-1 to 260-3, a third stop film 510, a third interlayer insulating layer 270, a third wiring layer 280, a fourth interlayer insulating layer 290, a plurality of contacts 170, 221, 222, 224, and 255, a color filter layer 520, a planarizing layer 530, and/or a microlens 540.

In comparison to some other embodiments, the embodiments may further includes the third stop film 510, and has the third interlayer insulating layer 270-1 and the fourth interlayer insulating layer 290-1 present only on the second interlayer insulating layer 250 at the logic region S2, the color filter layer 520 and the planarizing layer 520 formed on the third stop film 510 at the pixel region S1 and the fourth interlayer insulating layer 290-1 at the logic region S2, and/or the microlens 540 formed on the planarizing layer 530 at the pixel region S1.

The third stop film 510 at the pixel region S1 may be positioned lower than an upper side of the third interlayer insulating layer 270-1, in accordance with embodiments. The color filter layer 520 and the planarizing layer 530 at the pixel region S1 may be positioned lower than the color filter layer 520 and the planarizing layer 530 at the logic region S2, in accordance with embodiments. A space D1 between the second interlayer insulating layer 250 and the microlens 540 at the pixel region S1 may be smaller than a space D2 between the second interlayer insulating layer 250 and the color filter layer 520 at the logic region S2, in accordance with embodiments.

Embodiment with the first wiring layer M1 as an uppermost wiring layer at the pixel region S1, there may be no wiring layer present or necessary on the second interlayer insulating layer 250 at the pixel region S1. In embodiments, the reduction of space between the microlens 540 and the photodiode 120 may permit embodiments to improve the sensitivity of the image sensor.

FIG. 3 illustrates a section of an image sensor 300 in accordance with embodiments. Different than some embodiments, embodiments may further include a light guide layer 620 at the pixel region S1. The light guide layer 620 may be formed between the third stop film 510 and the color filter layer 520 at the pixel region S1 and the fourth interlayer insulating layer 290-1 and the color filter layer 520 at the logic region S2, in accordance with embodiments. The light guide layer 620 may pass through at least one of the third stop film 510, the second interlayer insulating layer 250, the insulating films 210, 175, and 160, and the second stop film 180 at the pixel region S1 to match and/or align with the photodiode 120 and/or the microlens 540. In embodiments, a portion of the light guide layer 620 may pass through to be in contact with the first stop film 155. In embodiments, the light guide layer 620 may be in contact with the first stop film 155 passed through the third stop film 510, the second interlayer insulating layer 250, the insulating films 210, 175, and 160, and the second stop film 180 at the pixel region S1.

Embodiments may prevent or substantially minimize crosstalk which may be liable to occur between adjacent pixels from taking place owing to the light guide layer 620 and may improve light collection efficiency to improve sensitivity.

Figure 4:
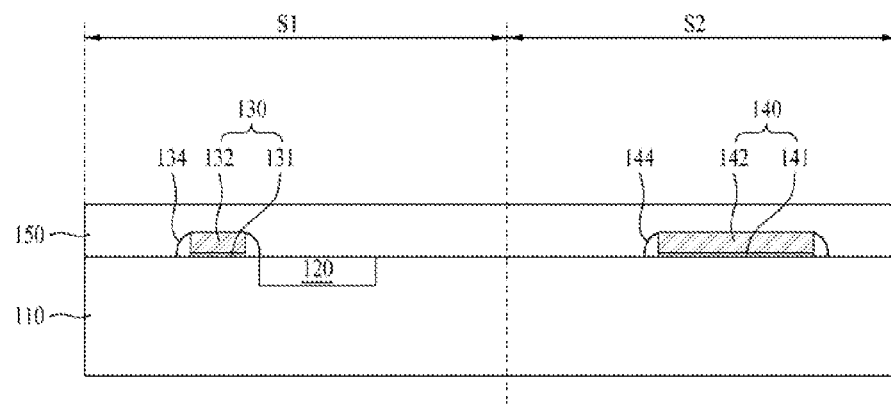

FIGS. 4 to 14 illustrate sections showing example steps of a method for fabricating an image sensor, in accordance with embodiments. A photodiode 120 may be formed in a portion of a substrate 110 at a pixel region S1. Though FIG. 4 illustrates only one photodiode, embodiments are not limited to this and embodiments include a plurality of the photodiodes formed in the substrate 110. In embodiments, the pixel region S1 may be divided into a plurality of unit pixels. The photodiode 120 may be formed in the substrate 110 matched to each of the unit pixels. In embodiments, the pixel region S1 is a region for forming a pixel which senses light and the logic region S2 may be a region at which a logic device or circuit may be formed for processing the light sensed at the pixel region S1 into an electric signal, which essentially changes the light signals into electrical signals.

For example, in embodiments, n type impurities may be injected into a p type semiconductor substrate 110 to form a pn junction therein to form the photodiode 120. A device isolation film may then be formed at the semiconductor substrate 110 for partitioning a device isolation region and an active region by STI (Shallow Trench Isolation) or LOCOS (Local Oxidation of Silicon), in accordance with embodiments. In embodiments, there may be a reversal or rearrangement of the order of formation of the photodiode 120 and the device isolation film.

At the time of formation of the photodiode 120 at the pixel region S1, source and drain of a logic transistor 140 may be formed in the substrate 110 at the logic region S2, in accordance with embodiments. In embodiments, formation of the source and drain of a logic transistor 140 may be performed after formation of a logic gate 140.

In embodiments, gates 130 and 140 of transistors may be formed on the substrate 110 at the pixel region S1 and the logic region S2 by thermal oxidation or chemical vapor deposition, respectively. For example, in embodiments, a gate insulating film 131 and 141 and a conductive layer 132 and 142 (e.g. a silicon layer) may be formed on the substrate 110 at the pixel region S1 and the logic region S2 and may be subjected to selective etching to form gates 130 and 140. Spacers 134 may further be formed on sidewalls of the gates 130 and 140, respectively, in accordance with embodiments. In embodiments, the gate 130 formed at the pixel region S1 may be a gate of at least one of transistors (e.g. see Sx, Dx, Rx, and Tx in FIG. 20) of the unit pixel and the gate 140 formed at the logic region S2 may be a gate of the logic transistor.

In embodiments, a first interlayer insulating layer 150 may be formed on the substrate 110 at the pixel region S1 and at the logic region S2 to bury the gates 130 and 140. In embodiments, the first interlayer insulating layer 150 may be a PMD (Pre Metal Dielectric) layer in a view that the first interlayer insulating layer 150 is formed before formation of the wiring layer (e.g. see 195-1 to 193-3 in FIG. 11). In embodiments, the first interlayer insulating layer 150 may be formed of at least one of BPSG (Borophospho Silicate Glass), PSG (Phosphorous Silicate Glass), and USG (Undoped Silicate Glass).

Figure 5:
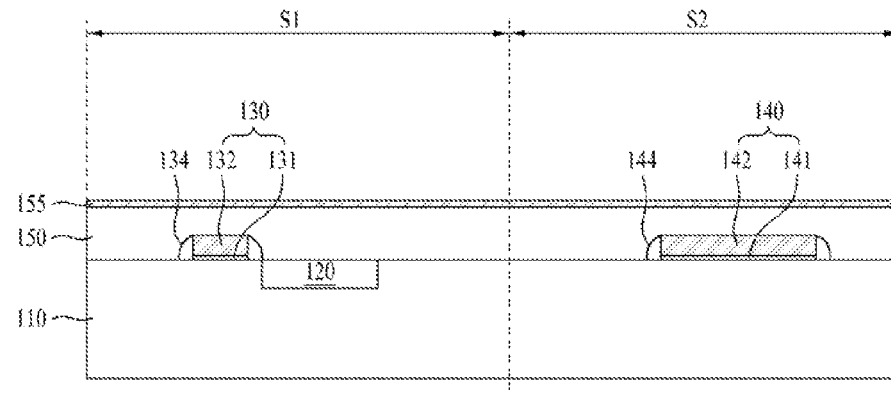

Referring to FIG. 5, a first stop film 155 may be formed on the first interlayer insulating layer 150 at the pixel region S and the logic region S2, in accordance with embodiments. For example, in embodiments, a silicon nitride film (e.g. SiN) may be deposited on the first interlayer insulating layer 150 at a thickness less than approximately 0.1 μm to form the first stop film 155.

Figure 6:
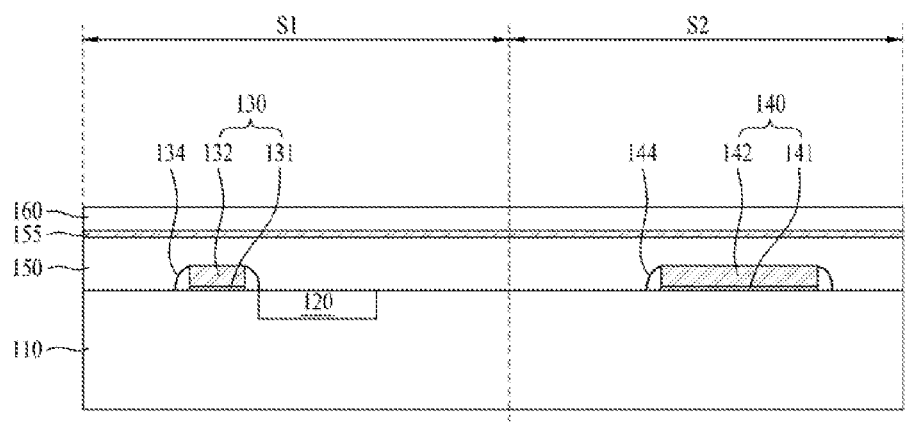

Referring to FIG. 6, a first insulating film 160 may be formed on the first stop film 155, in accordance with embodiments. For example, in embodiments, an oxide film (e.g. $SiO_2$) may be deposited on the first stop film 155 to form the first insulating film 160.

Figure 7:
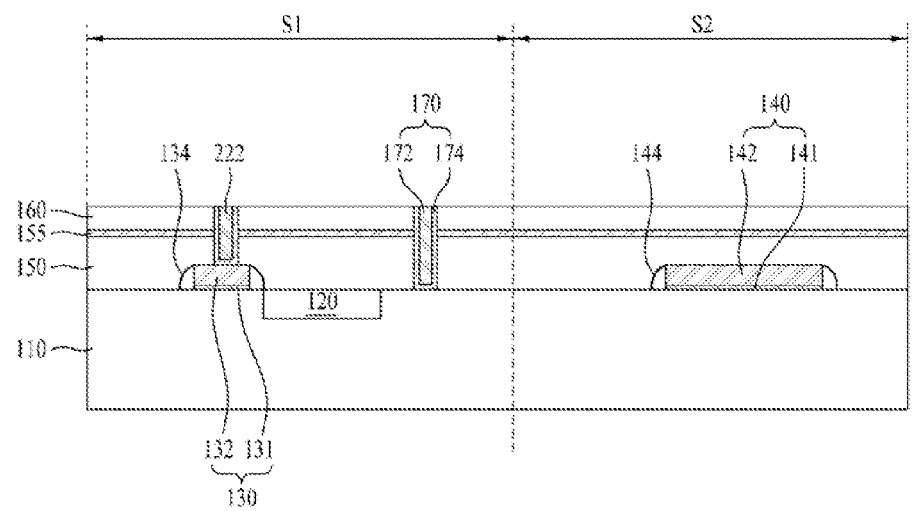

Referring to FIG. 7, at least one contact 170 and 222 (hereafter referred to as "contact 0") in contact with one of the substrate 110 and the pixel gate 130 passing through the first insulating film 160, the first stop film 155, and the first interlayer insulating layer 150 may be formed, in accordance with embodiments. For example, in embodiments, after forming a via hole to expose the substrate 110 passing through the first insulating film 160, the first stop film 155, and the first interlayer insulating layer 150 may be positioned with at least one of the pixel region S1 and the logic region S2 and at least one conductive material 172 may be filled in the via hole, to form the first contact 0 170.

After forming a via hole to expose an upper side of the pixel gate electrode 132 passing through the first insulating film 160, the first stop film 155, and a portion of the first interlayer insulating layer 150 positioned at the pixel region S1, at least one conductive material 172 may be filled in the via hole, to form a second contact 0 222, in accordance with embodiments. In embodiments, the conductive material may include at least one of tungsten and copper, or an alloy including at least one of tungsten and/or copper. In embodiments, in order to prevent ions of the conductive material from diffusing into the substrate 110 or the pixel gate electrode 132, a barrier metal 174, such as Ni, Ti and Ta, may be provided between the via hole and the conductive material 172. For example, in embodiments, the pixel gate electrode 132 may be a gate electrode of one of the transfer transistors Tx positioned at the pixel region. The second contact 0 222 may be in contact with a gate of one of the transfer transistors, in accordance with embodiments.

Figure 8:
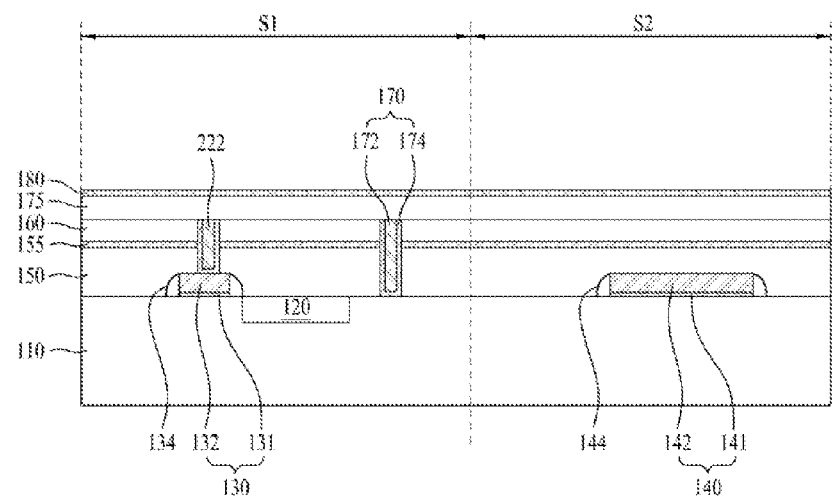

Referring to FIG. 8, a second insulating film 175 may be formed on the first insulating film 160 at the pixel region S1 and the logic region S2, in accordance with embodiments. In embodiments, the second insulating film 175 may cover an upper side of the contact 0 170 and 222. For example, in embodiments, a silicon oxide film (e.g. $SiO_2$) may be formed on the first insulating film 160 at a thickness of approximately 0.1 μm~0.2 μm to form the second insulating film 175. In embodiments, a second stop film 180 may be formed on the second insulating film 175 at the pixel region S1 and the logic region S2. For example, in embodiments, $HfO_2$ may be deposited on the second insulating film 175 at a thickness below approximately 0.01 μm to form the second stop film 180.

Figure 9:
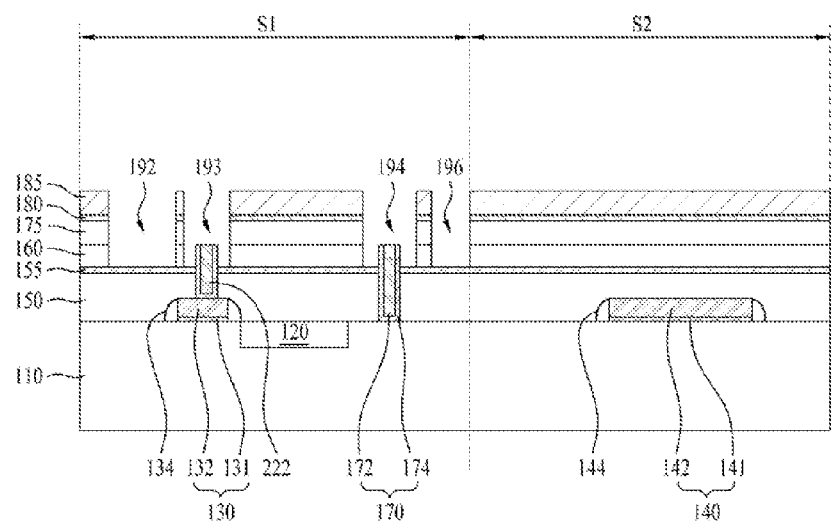

Referring to FIG. 9, a photoresist pattern 185 may be formed on the second stop film 180 by photolithography for forming a zero wiring layer 195-1 to 195-4, in accordance with embodiments. In embodiments, the second stop film 180, the second insulating film 175, the first insulating film 160 at the pixel region S1 are etched in succession with the photoresist pattern 185 as a mask until the first stop film 155 is exposed, to form at least one trench 192, 193, 194, and 196. The trench 192, 193, 194, and 196 may be patterned for forming the global interconnection, and may expose some of the contacts 0 170 and 222.

For example, in embodiments, any one of the trenches 192, 193, 194, and 196 may be formed to expose all of a plurality of the second contacts 0 each formed to be in contact with one of the transfer transistors Tx at the pixel region S1. In embodiments, a conductive material 180 filled in the trench 193 may connect the plurality of the second contacts 0 222 to one another electrically, to realize the global interconnection. In embodiments, etch selectivity between the insulating films 160 and 175 and the first stop film 155 may be approximately 8~10 and/or the first stop film 155 may serve as an etch stop film for forming the trenches 192, 193, 194, and 196.

Referring to FIGS. 7 to 9, the zero wiring layer 195-1 to 195-4 and the contact 0 may be formed by damascene, in accordance with embodiments. In embodiments, the first stop film 155 may prevent and/or substantially minimize the first interlayer insulating layer 150 or the pixel gate 130 and the logic gate 140 under the first interlayer insulating layer 150 from being damaging by etching and prevent a thickness of the first interlayer insulating layer 150 from reducing. In embodiments, as exemplified with reference to FIG. 13, the first stop film 155 may serve as an etch stop film at the time of formation of a recess 410 for forming the light guide layer 420.

Figure 10:
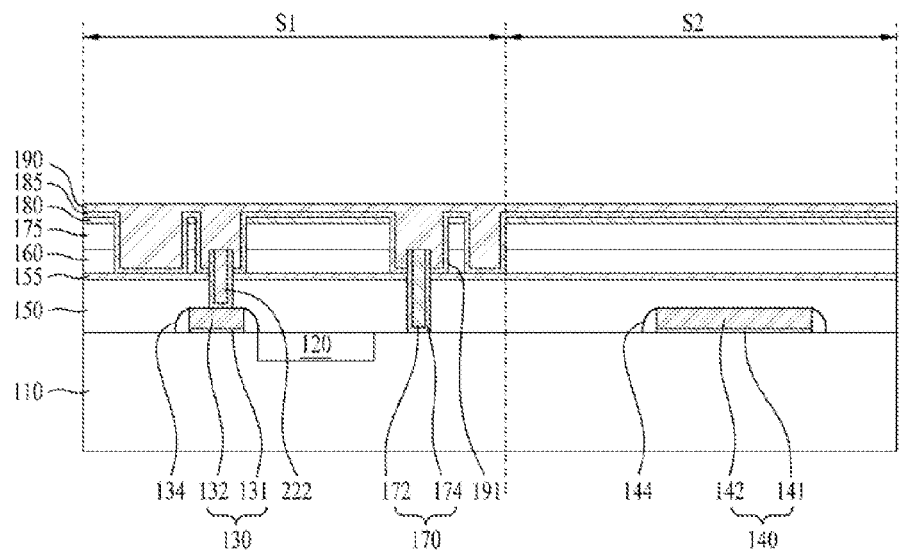

Referring to FIG. 10, ashing or stripping may be performed to remove remaining photoresist pattern 185, in accordance with embodiments. In embodiments, conductive materials 185 and 190 may be provided on the substrate 110 to bury at least one trench 192, 193, 194, and 196. In embodiments, the conductive material 190 may be filled in the at least one trench 192, 193, 194, and 196 and provided on the second stop film 180.

For example, in embodiments, the conductive material 190, such as at least one of tungsten, copper, and aluminum and/or an alloy including above metal, may be deposited on the at least one trench 192, 193, 194, and 196. In order to prevent ions of the conductive material 190 from diffusing into the substrate 110, a barrier metal 185 (e.g. such as Ni, Ti and Ta) may be provided between the trenches 192, 193, 194, and 196 and the conductive material 190, in accordance with embodiments.

Figure 11:
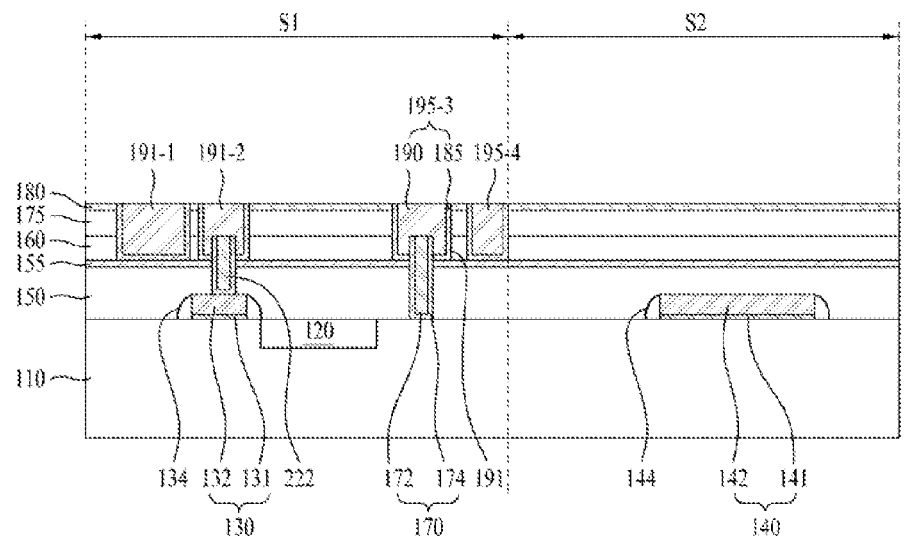

Referring to FIG. 11, a metal 190 may be subjected to planarizing throughout the entire surface of the substrate 110 having the conductive material 190 deposited thereon until the second stop film 180 is exposed, to form a zero wiring layer 195-1 to 195-4, in accordance with embodiments. For example, in embodiments, the conductive material 190 (e.g. tungsten) and the barrier metal 185 deposited on the substrate 110 may be removed until the second stop film 180 is exposed by CMP (Chemical Mechanical Polishing) to form the zero wiring layer 195-1 to 195-4 filled in the trenches 192, 193, 194, and 196. In embodiments, CMP selectivity between the conductive material 190 (e.g. tungsten) and the second stop film 180 (e.g. $HfO_2$) may be over 100:1. Since embodiments suggests using $HfO_2$ as the second stop film 180 of which selectivity to the conductive material 190 of the zero wiring layer 195-1 to 195-4 is high, a quality of the zero wiring layer 195-1 to 195-4 may be improved.

Figure 12:
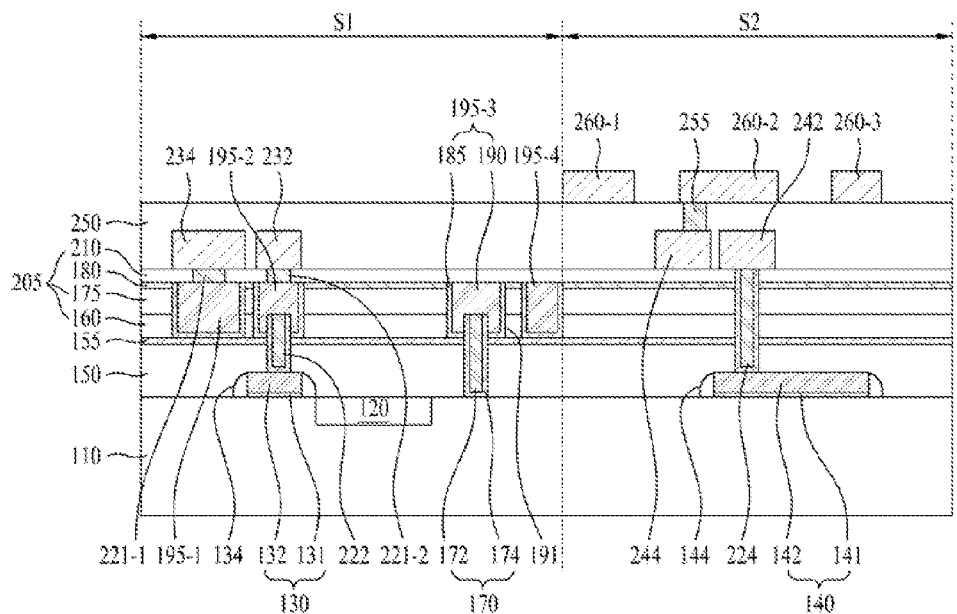

Referring to FIG. 12, a third insulating film 210 may be formed on the substrate 110 having the zero wiring layer 195-1 to 195-4 formed thereon, in accordance with embodiments. For example, in embodiments, an oxide film (e.g. $SiO_2$) may be deposited on the second stop film 180 to form the third insulating film 210.

Contacts 221-1 and 221-2 may then be formed in contact with the zero wiring layer 195-1 to 195-4 passing through the third insulating film 210 at the pixel region S1. Contact 224 may be formed in contact with an upper side of the logic gate electrode 142 passing through the third insulating film 210, the second stop film 180, the second insulating film 175, the first insulating film 160, the first stop film 155, and a portion of the first interlayer insulating layer 150 at the logic region S2. In embodiments, alike the contact 0 170 (and contact 222 described above), the contacts 221-1, 221-2 and 224 may include the conductive material and/or the barrier metal.

In embodiments, a first wiring layer 232, 234, 242, and 244 may be formed on the third insulating layer 210. Hereafter, the first wiring layer 232, 234, 242, and 244 will be called as "M1". For example, in embodiments, the first wiring line M1 may be formed to include at least one of: (1) a first wiring line 232 on the third insulating film 210 at the pixel region S1 in contact with the contact 221-1, (2) a second wiring line 234 on the third insulating film 210 at the pixel region S1 in contact with the contact 221-2, (3) a third wiring line 242 on the third insulating film 210 at the logic region S2 in contact with the contact 224, and/or (4) a fourth wiring line 244 on the third insulating film 210 at the logic region S2 spaced from the third wiring line 242. While the zero wiring line MO may only be formed at the pixel region S1 (in embodiments), the first wiring layer M1 may be formed at both the pixel region S1 and the logic region S2.

In embodiments, a second interlayer insulating layer 250 may be formed on the third insulating film 210 to bury the first wiring layer 232, 234, 242, and 244. A fourth contact 255 may be formed in contact with the first wiring layer (e.g. 244) positioned at the logic region S2 passing through a portion of the second interlayer insulating layer 250 at the logic region S2. In embodiments, a second wiring layer 260-1 to 260-3 may be formed on the second interlayer insulating layer 250 at the logic region S2. The second wiring layer (e.g. 260-2) may be formed on the second interlayer insulating layer 250 at the logic region S2 in contact with the fourth contact 255, in accordance with embodiments.

Figure 13:
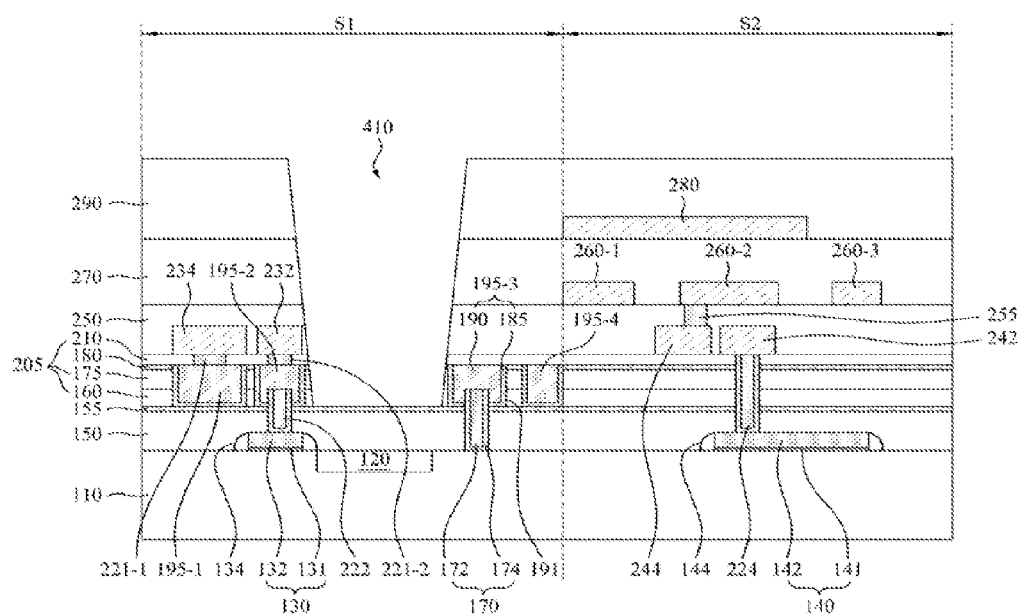

Referring to FIG. 13, a third interlayer insulating layer 270 may be formed on the second interlayer insulating layer 250 to bury the second wiring layer 260-1 to 260-3, in accordance with embodiments. In embodiments, a third wiring layer 280 may be formed on the third interlayer insulating layer 270 at the logic region S2. In embodiments, a fourth interlayer insulating layer 290 may be formed on the third interlayer insulating layer 270 to bury the third wiring layer 280.

Embodiments may omit the formation of the second wiring layer 260-1 to 260-3, the third interlayer insulating layer 270, the third wiring layer 280, and/or the fourth interlayer insulating layer 290. Embodiments may include the formation of at least one interlayer insulating layer on the fourth interlayer insulating layer 290 and/or a wiring layer which may be formed in the at least one interlayer insulating layer at the logic region S2.

In embodiments, the fourth to second interlayer insulating layers 290, 270, and 250, the third insulating film 210, the first stop film 180, the second insulating film 175, and/or the first insulating film 160 at the pixel region S1 may be selectively etched until the first stop film 155 is exposed, to form a recess 410. In embodiments, the recess 410 may be matched to and/or aligned with the photodiode 120. In embodiments, the first stop film 155 may serve as an etch stop film. The recess 410 may have a diameter which varies as the recess 410 goes from its top to its bottom. For example, in embodiments, the diameter of the recess 410 may decrease as the recess 410 goes from the top toward the bottom, an example of which is illustrated in FIG. 13.

Figure 14:
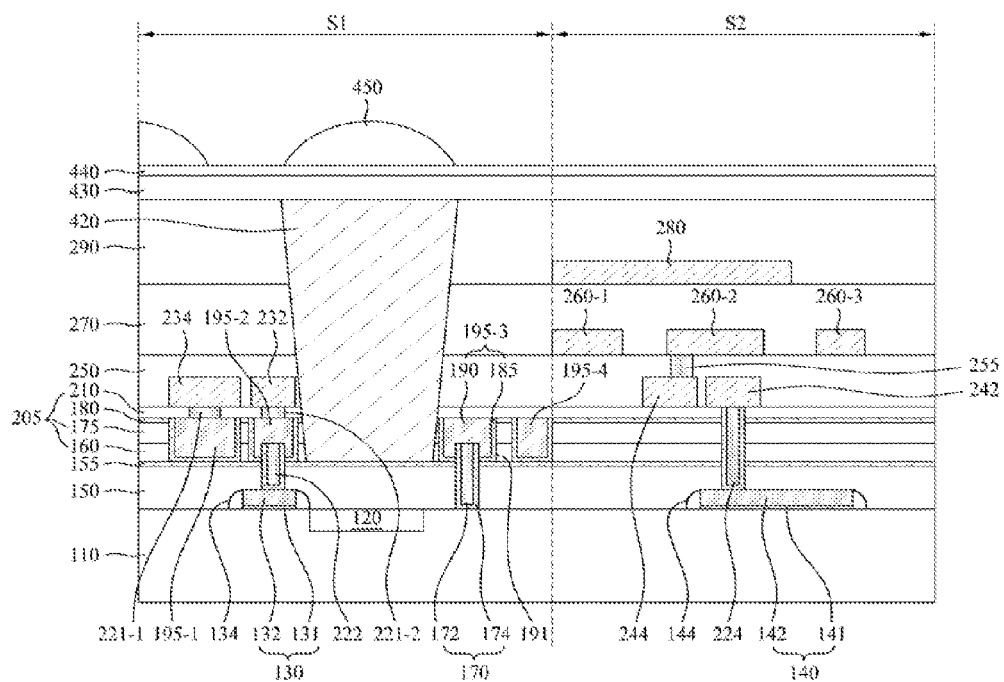

Referring to FIG. 14, a translucent insulating material having a refractive index different from the interlayer insulating layers 290, 270, and 250 and the insulating films 210, 175, and 160 may be filled in the recess 410 to form a light guide layer 420, in accordance with embodiments. For example, in embodiments, by filling a planer type organic material and/or inorganic material having a refractive index higher than the interlayer insulating layers 290, 270, and 250 and the insulating films 210, 175, and 160 into the recess 410, the light guide layer 420 may be formed.

In embodiments, a color filter layer 430 may be formed on the light guide layer 410 and/or the fourth interlayer insulating layer 290. The color filter layer may include a plurality of color filters (e.g. a blue color filter, a green color filter, and/or a red color filter) with each of the color filters formed to match and/or align with the photodiode 120, in accordance with embodiments. In embodiments, the blue color filter, the green color filter, and the red color filter may have thicknesses different from one another.

In embodiments, in order to protect the color filter layer 430 from moisture and scratch, a planarizing layer 440 may be formed on the color filter layer 430. In embodiments, a microlens 450 may be formed on the planarizing layer 440 at the pixel region S1. In embodiments, the microlens 450 may be formed on the planarizing layer 440 to align with the photodiode 120 and/or the color filter in a vertical direction. In embodiments, the microlens 340 may have a convex shape (e.g. a semi-sphere), but embodiments are not limited to a convex shape and also include shapes configured for collecting a light.

FIGS. 15 to 17 illustrate sections showing the steps of a method for fabricating an image sensor, in accordance with embodiments. Referring to FIG. 15, steps described with reference to FIGS. 4, and 6 to 12 are carried out, in accordance with embodiments. Different than other embodiments, a step for forming the first stop film 155 may be omitted. In embodiments, the second interlayer insulating layer 250 at the pixel region S1 and the logic region S2, and the third stop film 510 on the second wiring layer 260-1 to 260-3 at the logic region S2 may be formed. For example, in embodiments, a nitride film (e.g. SiN) may be formed on the second interlayer insulating layer 250 and the second wiring layer 260-1 to 260-3 at a thickness below approximately 0.5 µm to form the third stop film 510.

Referring to FIG. 16, a third interlayer insulating layer 270-1 may be formed on the third stop film 510 at the pixel region S1 and the logic region S2 and a third wiring layer 280 may be formed on the third interlayer insulating layer 270-1 at the logic region S2. A fourth interlayer insulating layer 290-1 may be formed on the third interlayer insulating layer 270-1 to bury the third wiring layer 280.

In embodiments, the fourth interlayer insulating layer 290-1 and the third interlayer insulating layer 270-1 at the pixel region S1 may be etched to remove the fourth interlayer insulating layer 290-1 and the third interlayer insulating layer 270-1 entirely until the third stop film 510 is exposed, which will be called as "trench etch". In embodiments, the third stop film 510 may serve as a trench etch stop film and selectivity between the interlayer insulating layers 290-1 and 270-1 and the third stop film 510 may be higher than 5:1.

Referring to FIG. 17, a color filter layer 520 may be formed on the third stop film 510 at the pixel region S1 exposed by the trench etch and on the fourth interlayer insulating layer 290 at the logic region S2, in accordance with embodiments. In embodiments, a planarizing layer 530 may be formed on the color filter layer 520 and a microlens 540 matched to the photodiode 120 and/or the color filter which may be formed on the polarizing layer 530 at the pixel region S1.

In embodiments, there may be a distance D3 from an upper side of the planarizing layer 530 at the pixel region S1 to the substrate 110 having the photodiode 120 formed therein that is smaller than a distance D4 from the upper side of the planarizing layer 530 at the logic region S2 to the substrate 110.

In embodiments, it may be advantageous for the interlayer insulating layers (e.g. 290-1 and 270-1) to be removed from the pixel region S1 (as shown in FIG. 16) to shorten a distance D1 of a light path between the photodiode 120 and the microlens 540. Embodiments may have reduced light loss and improved sensitivity.

In embodiments, if the third stop film 510 is not formed, the trench etch may be liable to damage the first wiring layer 232, 234, 242, and 244. For example, since a portion adjacent to a boundary of the pixel region S1 and the logic region S2 may be liable to be etched more than other portions in view of a nature of the trench etch, the first wiring layer 232, 234, 242, and 244 positioned under the boundary may be liable to be damaged by the etch process, in accordance with embodiments. In embodiments, the trench etch may be liable to create poor uniformity in the thickness of a wafer, which may affect subsequent formation of the color filter layer and the microlens, possibly making the light collection capability of the image sensor poor. However, these potentially negative attributes may not occur or may be negligible.

However, in embodiments, the formation of the third stop film 510 on the first wiring layer M1 may prevent the first wiring layer 232, 234, 242, and 244 from being damaging by the trench etch and allows for relatively dependable uniformity of the wafer thickness by adjusting an etch thickness, which may prevent the image sensor from having a poor light collection capability. In embodiments, by reducing the light path, light loss may be reduced and the sensitivity of the image sensor may be improved.

FIGS. 18 to 19 illustrate sections showing the steps of a method for fabricating an image sensor, in accordance with embodiments. As shown in FIG. 18, steps described with reference to FIGS. 4 to 12 may be carried out. In embodiments, a third stop film 510 may be formed on the second interlayer insulating layer 250 at the pixel region S1 and the logic region S2 and on the second wiring layer 260-1 to 260-3 at the logic region S2. The third stop film 510 may be identical to the one described with reference to FIG. 15.

In embodiments, a third interlayer insulating layer 270-1 may be formed on the third stop film 510 at the pixel region S1 and the logic region S2 and a third wiring layer 280 may be formed on the third interlayer insulating layer 270-1 at the logic region S2. In embodiments, a fourth interlayer insulating layer 290-1 may be formed on the third interlayer insulating layer 270-1 at the pixel region S1 and the logic region S2 to bury the third wiring layer 280.

In embodiments, the fourth interlayer insulating layer 290-1 and the third interlayer insulating layer 270-1 at the pixel region S1 may be etched to remove the fourth interlayer insulating layer 290-1 and the third interlayer insulating layer 270-1 from the pixel region S1 entirely until the third stop film 510 is exposed.

In embodiments, the third stop film 510, the second interlayer insulating layer 250, the insulating films 210, 175, and 160 and the second stop film 180 at the pixel region S1 may be etched selectively until the first stop film 155 is exposed to form a recess 610 matched to or aligned with the photodiode 120. For example, in embodiments, the recess 610 may have a diameter which becomes the smaller as the recess 610 goes from a top side thereof toward a bottom side thereof. In embodiments, the first stop film 155 may serve as an etch stop film.

Referring to FIG. 19, a translucent insulating material having a refractive index different from the second interlayer insulating layers 250 and the insulating films 210, 175, and 160 may be filled in the recess 610 to form a light guide layer 620, in accordance with embodiments. For example, in embodiments, by filling a planer type organic material or inorganic material having a refractive index higher than the interlayer insulating layer 250 and the insulating films 210, 175, and 160 in the recess 610, the light guide layer 620 may be formed.

In embodiments, a color filter layer 630 may be formed on the light guide layer 620 and a planarizing layer 640 may be formed on the color filter layer 630. In embodiments, a photodiode 120 and/or a microlens 650 may be matched to and/or aligned with the color filter formed on the planarizing layer 640 at the pixel region S1.

Embodiments may reduce light loss by reducing a light path with etching of the interlayer insulating layers 290-1 and 270-1 at the pixel region S1 and/or may improve light collection efficiency with the light guide layer 620 to prevent the cross talk from taking place and improve sensitivity.

Characteristics, structures, effects, and so on described in above embodiments are included to at least one of embodiments, but not limited to only one embodiment invariably. Furthermore, it is apparent that the features, the structures, the effects, and so on described in the embodiments can be combined, or modified with other embodiments by persons skilled in this field of art. Therefore, it is required to understand that such combination and modification is included to scope of the embodiments.

What is claimed is:

1. A method of fabricating an image sensor having a pixel region and a logic region, comprising:
    forming a photodiode in a substrate at the pixel region;
    forming a first interlayer insulating layer at least one of on and over the substrate;
    forming a first stop film at least one of on and over the first interlayer insulating layer;
    forming an insulating film at least one of on and over the first stop film;
    forming a second stop film at least one of on and over the insulating film;
    forming at least one trench that exposes the first stop film by selective etching of the second stop film and the insulating film positioned at the pixel region;
    forming conductive material at least one of on and over the second stop film to fill the at least one trench;
    forming a zero wiring layer in the at least one trench by planarizing the conductive material until the second stop film is exposed;
    forming a recess matched to the photodiode by selective etching at least one of said at least one third interlayer insulating layer, the second interlayer insulating layer, the second stop film, the insulating film at the pixel region until the first stop film is exposed; and
    forming a light guide layer by filling an insulating material having a refractive index different from the refractive index of at least one of said at least one third interlayer insulating layer, the second interlayer insulating layer, and the insulating film formed in the recess.

2. The method of claim 1, comprising forming at least one contact in contact with the substrate at the pixel region, wherein said at least one contact passes through the first interlayer insulating layer and the first stop film before said forming at least one trench.

3. The method of claim 1, wherein:
    the insulating film and the first stop film have an etch selectivity of approximately 8~10:1 therebetween; and
    the conductive material and the second stop film have selectivity over approximately 100:1 therebetween.

4. The method of claim 3, wherein;
    said forming a first stop film comprises depositing a silicon nitride film to form the first stop film; and
    said forming a second stop film comprises depositing HfO$_2$ to form the second stop film.

5. The method of claim 1, comprising:
    forming a plurality of gates on the substrate at the pixel region; and
    forming contacts in contact with upper sides of the plurality of gates that pass through the first stop film and a portion of the first interlayer insulating layer, wherein said forming contacts is performed prior to said forming the first interlayer insulating layer and wherein the zero wiring layer is formed to contact each of the contacts.

6. The method of claim 1, comprising:
    forming a first wiring layer at least one of on and over the second stop film at the pixel region and the logic region;
    forming a second interlayer insulating layer at least one of on and over the second stop film to cover the first wiring layer;
    forming a second wiring layer at least one of on and over the second interlayer insulating layer at the logic region; and
    forming at least one third interlayer insulating layer at least one of on and over the second interlayer insulating layer at the pixel region and the logic region to cover the second wiring layer.

7. The method of claim 1, comprising:
    forming a color filter layer at least one of on and over the light guide layer and said at least one third interlayer insulating layer; and forming a microlens at least one of on and over the color filter layer.

8. A method of fabricating an image sensor having a pixel region and a logic region, comprising:
forming a photodiode in a substrate at the pixel region;
forming a first interlayer insulating layer at least one of on and over the substrate;
forming a first stop film at least one of on and over the first interlayer insulating layer;
forming an insulating film at least one of on and over the first stop film;
forming a second stop film at least one of on and over the insulating film;
forming at least one trench that exposes the first stop film by selective etching of the second stop film and the insulating film positioned at the pixel region;
forming conductive material at least one of on and over the second stop film to fill the at least one trench;
forming a zero wiring layer in the at least one trench by planarizing the conductive material until the second stop film is exposed;
forming a third stop film at least one of on and over the second interlayer insulating layer at the pixel region and the logic region and at least one of on and over the second wiring layer at the logic region;
etching said at least one third interlayer insulating layer at the pixel region until the third stop film is exposed;
forming a color filter layer at least one of on and over the third stop film exposed at the pixel region and at least one of on and over said at least one third interlayer insulating layer at the logic region; and
forming a microlens at least one of on and over the color filter layer at the pixel region, after said forming the second wiring layer and before said forming said at least one third interlayer insulating layer.

9. The method of claim 8, comprising forming at least one contact in contact with the substrate at the pixel region, wherein said at least one contact passes through the first interlayer insulating layer and the first stop film before said forming at least one trench.

10. The method of claim 8, wherein:
the insulating film and the first stop film have an etch selectivity of approximately 8~10:1 therebetween; and
the conductive material and the second stop film have selectivity over approximately 100:1 therebetween.

11. The method of claim 10, wherein;
said forming a first stop film comprises depositing a silicon nitride film to form the first stop film; and
said forming a second stop film comprises depositing $HfO_2$ to form the second stop film.

12. The method of claim 8, comprising:
forming a plurality of gates on the substrate at the pixel region; and
forming contacts in contact with upper sides of the plurality of gates that pass through the first stop film and a portion of the first interlayer insulating layer, wherein said forming contacts is performed prior to said forming the first interlayer insulating layer and wherein the zero wiring layer is formed to contact each of the contacts.

13. The method of claim 8, comprising:
forming a first wiring layer at least one of on and over the second stop film at the pixel region and the logic region;
forming a second interlayer insulating layer at least one of on and over the second stop film to cover the first wiring layer;
forming a second wiring layer at least one of on and over the second interlayer insulating layer at the logic region; and
forming at least one third interlayer insulating layer at least one of on and over the second interlayer insulating layer at the pixel region and the logic region to cover the second wiring layer.

14. A method of fabricating an image sensor having a pixel region and a logic region, comprising:
forming a photodiode in a substrate at the pixel region;
forming a first interlayer insulating layer at least one of on and over the substrate;
forming a first stop film at least one of on and over the first interlayer insulating layer;
forming an insulating film at least one of on and over the first stop film;
forming a second stop film at least one of on and over the insulating film;
forming at least one trench that exposes the first stop film by selective etching of the second stop film and the insulating film positioned at the pixel region;
forming conductive material at least one of on and over the second stop film to fill the at least one trench;
forming a zero wiring layer in the at least one trench by planarizing the conductive material until the second stop film is exposed;
forming a third stop film at least one of on and over the second interlayer insulating layer at the pixel region and the logic region and at least one of on and over the second wiring layer at the logic region;
etching said at least one third interlayer insulating layer at the pixel region until the third stop film is exposed;
forming a recess matched to the photodiode by selective etching of the third stop film, the second interlayer insulating layer, the second stop film, and the insulating film at the pixel region until the first stop film is exposed;
forming a light guide layer by filling an insulating material having a refractive index different from the second interlayer insulating layer and the insulating film in the recess;
forming a color filter layer at least one of on and over the light guide layer at the pixel region; and
forming a microlens on the color filter layer, after the step of forming the second wiring layer and before the step of forming said at least one third interlayer insulating layer.

15. The method of claim 14, comprising forming at least one contact in contact with the substrate at the pixel region, wherein said at least one contact passes through the first interlayer insulating layer and the first stop film before said forming at least one trench.

16. The method of claim 14, wherein:
the insulating film and the first stop film have an etch selectivity of approximately 8~10:1 therebetween; and
the conductive material and the second stop film have selectivity over approximately 100:1 therebetween.

17. The method of claim 16, wherein;
said forming a first stop film comprises depositing a silicon nitride film to form the first stop film; and
said forming a second stop film comprises depositing $HfO_2$ to form the second stop film.

18. The method of claim 14, comprising:
forming a plurality of gates on the substrate at the pixel region; and
forming contacts in contact with upper sides of the plurality of gates that pass through the first stop film and a portion of the first interlayer insulating layer, wherein said forming contacts is performed prior to said forming the first interlayer insulating layer and wherein the zero wiring layer is formed to contact each of the contacts.

19. The method of claim 14, comprising:

forming a first wiring layer at least one of on and over the second stop film at the pixel region and the logic region;

forming a second interlayer insulating layer at least one of on and over the second stop film to cover the first wiring layer;

forming a second wiring layer at least one of on and over the second interlayer insulating layer at the logic region; and forming at least one third interlayer insulating layer at least one of on and over the second interlayer insulating layer at the pixel region and the logic region to cover the second wiring layer.

* * * * *